United States Patent [19]

Boice

[11] 4,047,164

[45] Sept. 6, 1977

[54] READ AND WRITE DRIVE SYSTEM FOR A 2½D COINCIDENT CURRENT MAGNETIC CORE MEMORY

[75] Inventor: Michael F. Boice, Torrance, Calif.

[73] Assignee: Electronic Memories & Magnetics Corporation, Los Angeles, Calif.

[21] Appl. No.: 611,227

[22] Filed: Sept. 8, 1975

[51] Int. Cl.² .............................................. G11C 11/02
[52] U.S. Cl. ........................ 340/174 M; 340/174 LA
[58] Field of Search ...... 340/174 M, 174 LA, 174 CS

[56] References Cited

U.S. PATENT DOCUMENTS

| | | | |
|---|---|---|---|
| 3,425,044 | 1/1969 | Ferrier | 340/174 LA |
| 3,440,624 | 4/1969 | Sherlock | 340/174 LA |
| 3,500,359 | 3/1970 | Hsieh | 340/174 M |
| 3,568,152 | 3/1971 | Jallen | 340/174 LA |
| 3,568,170 | 3/1971 | Catalani | 340/174 LA |
| 3,573,764 | 4/1971 | Larsen | 340/174 LA |
| 3,603,938 | 9/1971 | Cooper | 340/174 LA |
| 3,623,033 | 11/1971 | Harding | 340/174 LA |
| 3,651,497 | 3/1972 | Cook | 340/174 M |
| 3,675,221 | 7/1972 | Harding | 340/174 LA |
| 3,849,768 | 11/1974 | Durvasula | 340/174 LA |

*Primary Examiner*—Thomas B. Habecker
*Attorney, Agent, or Firm*—Lindenberg, Freilich, Wasserman, Rosen & Fernandez

[57] ABSTRACT

A read and write drive system is disclosed for a 2½D coincident current magnetic core memory of the type in which for each word bit, bit lines threaded through the magnetic cores are arranged in a matrix of M groups, each of N bit lines. The drive system includes for the bit line matrix of each word bit a separate set of M write drive switches, and for n matrices of n different word bits, wherein $n \geq 2$, M read sink switches, N read drive switches and N write sink switches. These switches are used to apply ½ drive current through selected bit lines, during the read operation, to read out the n word bits of a selected word and to apply ½ drive current to independently store either a binary 1 or a binary 0 in each of the n word bits. The total number of switches, required for n word bits, is $M(n+1) + 2N$ switches.

3 Claims, 3 Drawing Figures

READ AND WRITE DRIVE SYSTEM FOR A 2½D COINCIDENT CURRENT MAGNETIC CORE MEMORY

BACKGROUND OF THE INVENTION

1. Field of the Invention

The present invention generally relates to a magnetic core memory drive system and, more particularly, to a read and write drive system for a 2½D magnetic core memory.

2. Description of the Prior Art

The advantages of a 2½D coincident current magnetic core memory, as compared with a 2D or 3D memory, are well known. In such a 2½D memory, magnetic cores used to store the corresponding but, e.g., the least significant bit, of all the multibit words are threaded by a plurality of word lines and a plurality of bit lines. One word line and one bit line are threaded through each core. The bit lines threaded through the cores storing the same bit of all the words are interconnected to form a matrix of a plurality of groups of bit lines with an equal number of bit lines per group. Typically, the number of groups and the bit lines per group are powers of two. Different cores storing different bits of the same word are threaded by the same word line and by corresponding bit lines of the different bit line matrices. For example, a 2½D memory of a capacity of 8192 words, with 512 word lines incudes 16 bit lines per word bit. The 16 bit lines are arranged in a matrix of M groups each of N bit lines where M·N = 16. Assuming that each word is of 8 bits, the memory includes 8 bit line matrices, each of 16 bit lines.

Herebefore the drive circuitry associated with each word bit includes 2(M+N) separate switches, e.g., M separate write drive switches, M separate read sink switches, N separate read drive switches and N separate write sink switches. These switches are used to drive through a selected bit line ½ read drive current in one direction during a read operation, and ½ write drive current in the opposite direction during a write operation, if the bit of the particular addressed word is to store a binary 1. Generally, M and N are chosen so as to minimize the total number of required switches per word bit. Where M·N = 16, M = N = 4, so that the total number of switches if 2(M+N) = 2·8 = 16. Clearly, if the 16 bit lines were divided into two groups (M=2) with eight (N=8) bit lines per group the total number of required switches would be 2(M+N) = 2·10 = 20.

It is apparent that in order to minimize the memory cost and reduce its complexity it is highly desirable to be able to reduce the total number of required switches for the entire memory.

OBJECTS AND SUMMARY OF THE INVENTION

It is a primary object of the present invention to provide a new read and write drive system for a 2½D magnetic core memory.

Another object of the present invention is to provide a new read and write drive system for a 2½D magnetic core memory in which the number of required switches is minimized.

These and other objects of the invention are achieved by providing read drive switches, and read and write sink switches which serve the bit lines associated with more than one word bit. Assuming that for each word bit the bit lines are arranged in a matrix of M grups and N bit lines per group, in accordance with the present invention, N read drive switches N write sink switches and M read sink switches are used to drive the bit line associated with more than one word bit. For each word bit M separate write drive switches are required to drive any of its associated MN bit lines.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
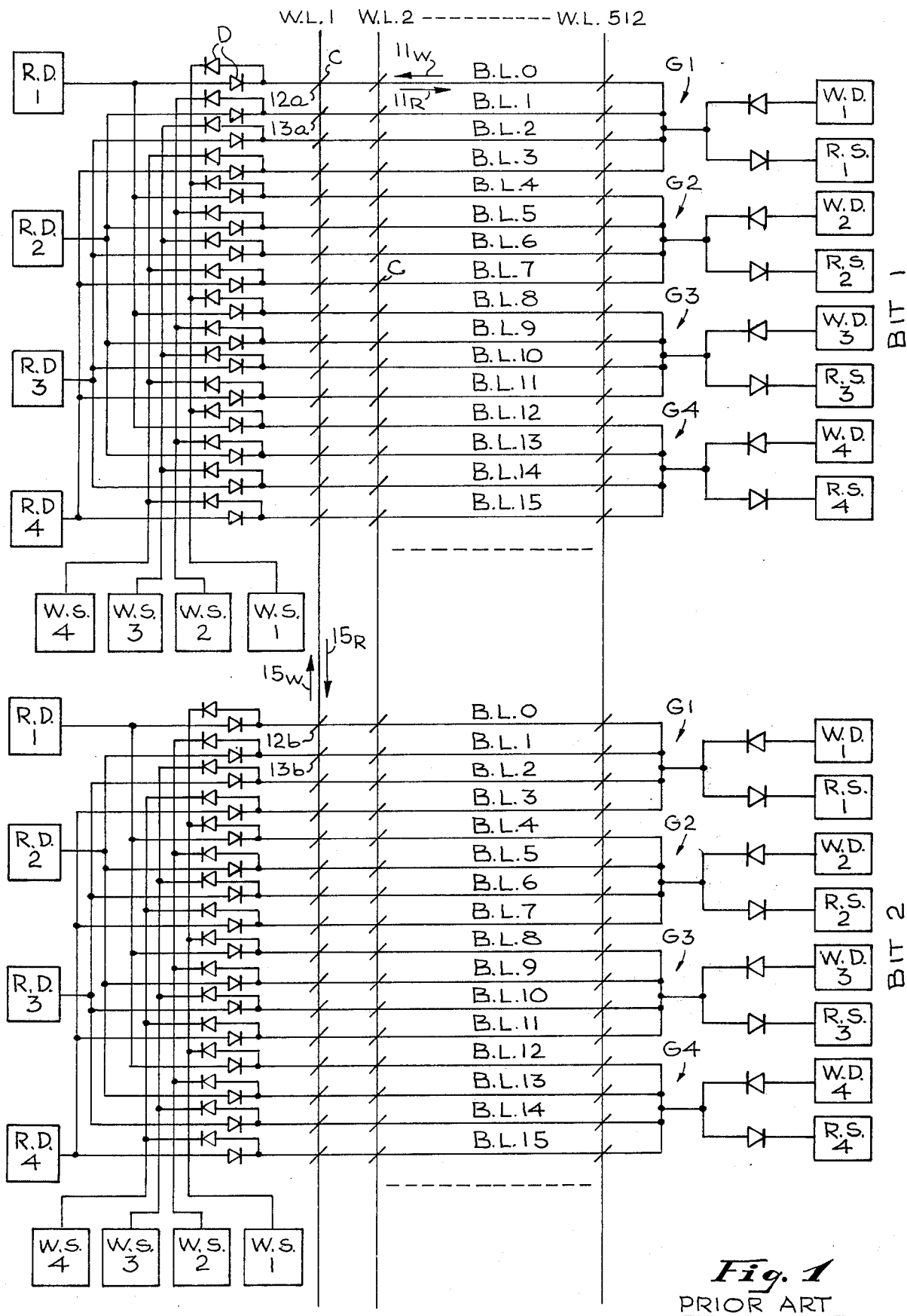
FIG. 1 is a simplified diagram of a prior art 2½D memory for two word bits.

The novelty of and the significant advantages realized with the present invention may best be appreciated by first reviewing the present state of the art. FIG. 1 is a diagram of a 2½D coincident current magnetic core memory for two word bits, BIT 1 and BIT 2, and the drive circuitry associated therewith. The memory is assumed to have a capacity of 8192 words. It has 512 word lines, three of which are designated by W.L.1, W.L.2, and W.L. 512 and 16 bit lines designated B.L.0-B.L.15 for each word bit. The 16 bit lines of each bit are divided into four groups G1-G4, each of four bit lines, thus forming a 4 × 4 matrix of bit lines. The magnetic cores through which the lines are threaded are generally designated by C, and the conventional blocking diodes are designated by D.

Associated with the bit lines of BIT 1, are four read drive switches R.D.1-R.D.4, which are respectively connected to the first through the fourth bit lines of each of the four groups. That is, R.D.1 is connected to the first bit lines B.L.0, B.L.4, B.L.8 and B.L.12 of groups G1-G4. R.D.2 is connected to the second bit lines of groups G1-G4, etc. Similarly, four write sink switches W.S.1-W.S.4 are respectively connected to the first through the fourth bit lines of each of the four groups. Also included are four write drive switches W.D.1-W.D.4 and four read sink switches R.S.1-R.S.4. W.D.1 and R.S.1 are connected to all the bit lines of group G1, W.D.2 and R.S.2 are connected to all the bit lines of group G2, etc. A similar identical set of switches is provided for and connected to the 16 bit lines of BIT 2.

The blocking diodes are poled for read current to flow through the bit lines from left to right, as represented by arrow $11_R$, while the write current is assumed to flow from right to left, as represented by arrow $11_W$. Different bits of the same multibit word are stored in cores at corresponding locations in the different bit line matrices, with all the cores storing the bits of any word being threaded by the same word line. Thus, for example, cores 12a and 12b, threaded by word lines W.L.1 and by the first bit lines B.L.0 of BITS 1 and 2 respectively, store bits of the same word, while cores 13a and 13b threaded by W.L.1 and bit lines B.L.1 of the two different word bits store bits of another word.

As is appreciated any word is addressed by using part of its address to apply one-half of the drive current, designated 1/2I, to the word line which threads the cores storing the word bits. During a read operation 1/2I flows in the word line in one direction as represented by arrow $15_R$ and in the opposite direction during a write operation, as represented by $15_W$. During the read operation the rest of the word address is used to activate one of the read drive switches and one of the read sink switches associated with each bit so as to apply 1/2I read drive current through the appropriate bit line. A sense line (not shown) for each word bit senses the effect of the total coincident drive current of 1/2I + 1/2I = I on the core threaded by the lines through which the drive currents flow, thereby indicating whether the core stores a binary 1 or a binary 0.

For example, to read out the word whose bits are stored in cores 12a and 12b, 1/2I is passed through W.L.1. Also, R.D.1 and R.S.1 of BIT 1 are turned on to pass 1/2I through bit lines B.L.0 threaded through core 12b. On the other hand to read out the word whose bits are stored in cores 13a and 13b while 1/2I passes through W.L.1, R.D.2 and R.S.1 of each bit are activated to pass 1/2I through each of bit lines B.L.1.

During a write operation 1/2I is passed through the word line of the addressed word in the direction of arrow $15_W$. Also for each word bit one of the four write sink switches W.S.1-W.S.4 is activated, depending on the word address. However, whether or not the write drive switch is turned on depends on whether a binary 1 or a binary 0 is to be stored. Thus, if during the write operation a binary 1 is to be stored in core 12a and a binary 0 in core 12b, while W.S.1 of each of BIT 1 and BIT 2 is turned on, W.D.1 of BIT 1 is turned on to pass 1/2I in the direction of $11_W$ through B.L.0 of BIT 1, thus storing a binary 1 in core 12a. However, W.D.1 or BIT 2 is not turned on. Consequently, only 1/2I passes through the lines threaded through core 12b, and therefore core 12b remains in the binary 0 state. The manner in which the cores, storing the different multibit words, are addressed and driven either during the read or write operation are well known by those familiar with 2 1/2D coincident magnetic core memories. Therefore, they will not be described in further detail.

As is appreciated by those familiar with the art, and as shown in FIG. 1, the matrix of bit lines of each word bit is associated with a separate set of read and write drive and sink switches. The number of switches for the read operation is equal to M+N where M and N are the number of bit line groups and the number of bit lines per group, respectively. Similarly, the number of switches for the write operation is M+N. Thus, the total number of switches per word bit is 2(M+N). For 16 bit lines per word bit when M=N=4, the total number of switches per bit is 2(4+4) = 16. This is the minimum that has been required in the prior art. Thus, for such a memory with 8 bits per word 8 × 16 = 128 switches are required.

Unlike the prior art in accordance with the present invention a read and write drive system is provided in which the number of switches is greatly reduced as compared with the prior art. The basic aspect of the present invention may best be explained in connection with FIG. 2 which is similar to FIG. 1 except for the reduced number of required switches. Basically, in the present invention, while the bit lines associated with each word bit require the same number of write drive switches, as in the prior art, the other switches are used to drive the bit lines of more than one word bit. Consequently, a large reduction in the total number of required switches is realized.

Figure 2:
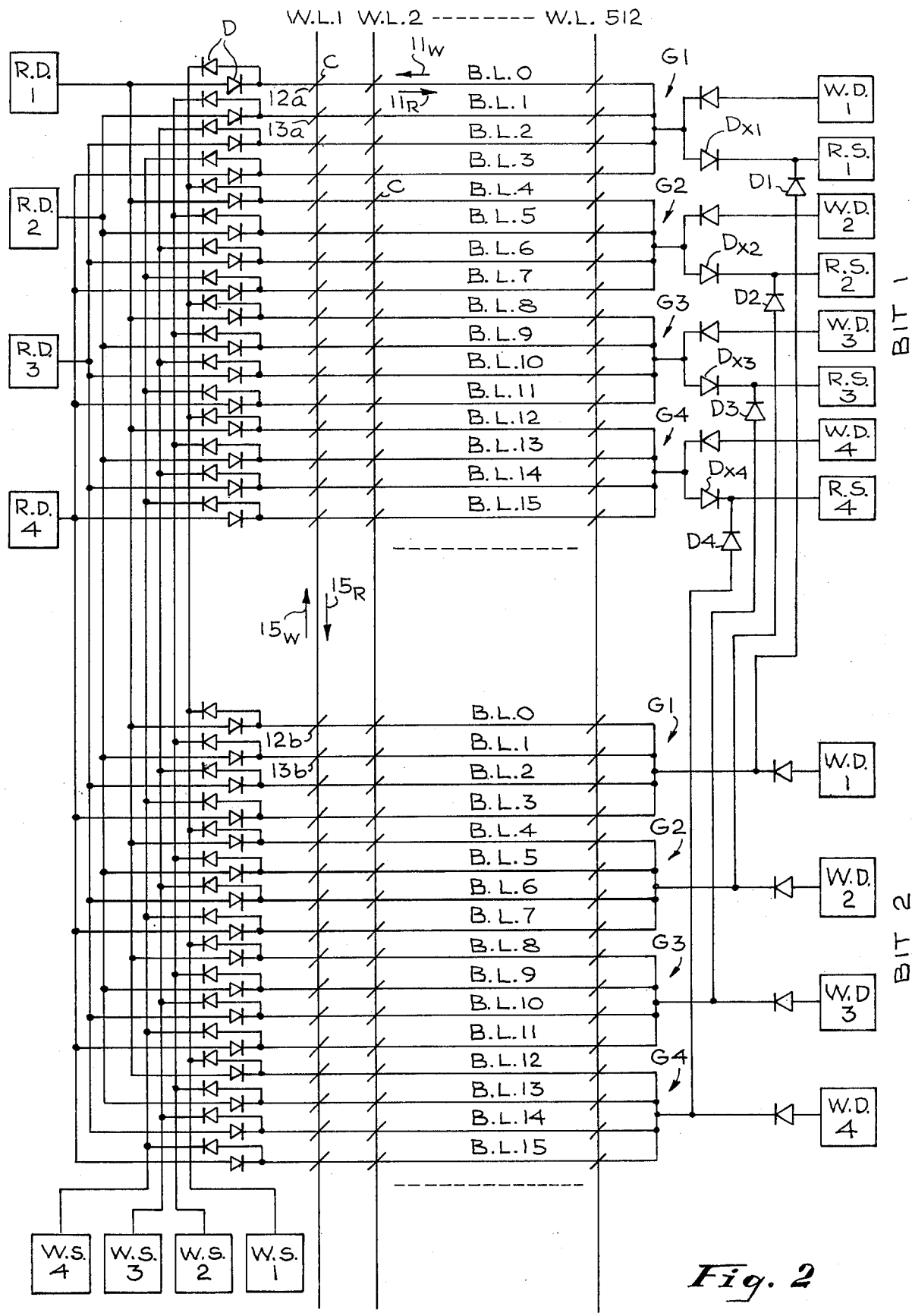
FIG. 2 is a simplified diagram of the present invention for two word bits of a 2½D memory.

As seen from FIG. 2 for the two 4 × 4 bit line matrices of BIT 1 and BIT 2 a single set of four read drive switches R.D.1-R.D.4 are respectively connected to the first through fourth bit lines of each bit line group of both BIT 1 and BIT 2. Also, a single set of four write sink switches W.S.1-W.S.4 is required for the bit lines of both BIT 1 and BIT 2, with W.S.1-W.S.4 respectively connected to the first through fourth bit lines of each bit line group. In addition, a single set of four read sink switches R.S.1 -R.S.4 is required. R.S.1 is connected to bit lines of group G1 of BIT 1 and in addition to the bit line group G1 of BIT 2 through a diode D1. Similarly, R.S.2 through R.S.4 are connected to bit line groups G2 through G4 respectively of BIT 1 and to the corresponding groups of BIT 2 through diodes D2-D4. The function of diodes D1-D4 will be explained hereinafter. In addition, each set of bit lines of each word bit is provided with a separate set of four write drive switches W.D.1-W.D.4, as in the prior art.

Except for the write drive switches, the only difference between the rest of the switches used in the present invention, as compared with switches performing identical functions in the prior art, is their current dissipation. In the prior art each switch only supplies or provides a path for one-half the drive current (I) necessary to switch the core from one of its states to the other. Thus, each drive switch supplies 1/2I and each sink switch supplies a current path for 1/2I. Therefore, each prior art switch requires a current dissipation rating of not less than 1/2I. In the present invention, the switches, other than the write drive switches, require a current dissipation rating of n(1/2I) where n represents the number of word bits served in common by the same switches. In FIG. 2, n = 2 and therefore each of R.D.1 = R.D.4, R.S.1-R.S.4 and W.S.1-W.S.4 has to have a current dissipation rating of 2(1/2I) = I. With presently available magnetic cores requiring low drive current, known switches can be used to supply 1/2 drive current simlutaneously in more than one bit line.

In operation to read out the bits stored in cores 12a and 12b, 1/2I flows in W.L.1 in the direction of arrow $11_R$. Also, R.D.1 and R.S.1 are turned on. R.D.1 provides drive current of a magnitude I, half of which i.e., 1/2I flows through B.L.0 threaded through core 12a to R.S.1, while the other half of I (1/2I) from R.D.1 flows through B.L.0 which is threaded through core 12b to R.S.1 through diode D1. Thus, R.D.1 simultaneously provides read drive current of 1/2I, to bit line B.L.0 of BIT 1 and to bit line B.L.0 of BIT 2. Similarly, each of R.D.2-R.D.4 when addressed, provides I drive current, which is divided into two halves which pass through two corresponding bit lines of BIT 1 and BIT 2. Each of R.S.2-R.S.4 when activated, provides a sink for the currents flowing in two corresponding bit lines of BIT 1 and BIT 2. The total current dissipated in any of these switches is 2(1/2I) = I.

During a write operation or cycle one of the write sink switches W.S.1-W.S.4 is turned on. Each of these switches has a current dissipation rating of not less than I. However, the actual current dissipated therein depends on the desired states of BIT 1 and BIT 2. If both are to be binary 1s the current dissipated in the activated write sink switch is 2(1/2I) = I. On the other hand if one of the word bits is to be a binary 0 the current dissipated is only 1/2I. No current passes through an activated write sink switch when both BIT 1 and BIT 2 are to be in the binary 0 state.

Assuming that a binary 1 state is to be stored in core 12a and a binary 0 in core 12b, i.e., BIT 1 is to be a binary 1 and BIT 2 a binary 0, W.S.1 is activated. In addition, W.D.1 associated with BIT 1 is activated. Consequently, 1/2I from W.D.1 flows in B.L.0 of BIT 1, which together with the ½ drive current on W.L.1 switches core 12a to a binary 1 state. The 1/2I current in B.L.0 of BIT 1 passes through activated W.S.1. However, since core 12b is to store a binary 0, W.D.1 of BIT 2 is not activated. Therefore, no current flows in B.L.0 of BIT 2 and core 12b remains in the binary 0 state.

In order to prevent any part of the 1/2I write drive current, provided by activated W.D.1 of BIT 1, from reaching B.L.0 of BIT 2, when W.D.1 of BIT 2 is not activated, diode D1 is included. It blocks any write drive current from W.D.1 of BIT 1 from reaching any of the bit lines of groups G1 of BIT 2. However, it permits read drive current passing through any of the bit lines of G1 of BIT 2 to pass to the read sink switch R.S.1. A function similar to that of D1 is performed by the diode $D_{X1}$, which is connected between group G1 of BIT 1 and R.S.1. This diode prevents any write drive current from W.D.1 of BIT 2, when the latter is activated, from reaching any of the bit lines of G1 of BIT 1. Diodes D2-D4 perform functions analogous to that of diode D1 when any of W.D.2-W.D.4 of BIT 1 is activated and the corresponding W.D.2-W.D.4 of BIT 2 is not activated. Similarly, diodes $D_{X2}$-$D_{X4}$, perform functions analogous to diode $D_{X1}$.

From the foregoing it should thus be appreciated that the switches, shown in FIG. 2, act as the read and write drive system for both BIT 1 and BIT 2 and perform the same functions performed in the prior art by the switch arrangement shown in FIG. 1. However, whereas, in the prior art 16 separate switches are needed for each word bit, for a total of 32 switches for both BIT 1 and BIT 1, in accordance with the present invention only 20 switches are required for both word bits. Thus, the present invention accounts for a substantial reduction in the nunber of required switches, without any loss in performance.

It should be appreciated from the foregoing that in accordance with the present invention while each matrix of bit lines of a different word bit has its separate set of write drive switches the rest of the switches are used or associated with bit lines of more than one word bit. Thus, they will be referred to as common switches, since they serve in common the bit lines of more than one word bit. The number of word bits whose bit lines are associated with the common switches depends on the current dissipation rating of these switches. While the current dissipation rating of each of the write drive switches has to be not less than 1/2I, where I is the full core drive current, the switches commonly used by the bit lines of more than one word bit must have a current rating not less than I. Generally, if the bit lines of n word bits are served by common switches the current rating of each of the common switches must be not less than n(1/2I).

In the present invention since the bit line matrix of each word bit has its separate set of write drive switches it is desirable to arrange the bit lines of each word bit in a matrix of groups in which the number of groups designated M, is not greater than the number of bit lines per group, designated N, and provide M separate write drive switches each connected to a different group in the matrix. Generally, M and N are both powers of two, with M ≤ N.

In general terms it can be stated that in the prior art for M·N bit lines per word bit the number of required switches per word bit is 2(M+N). For n word bits 2n(M+N) switches are required. However, in accordance with the present invention for n word bits the number of required switches is as follows:

nM write drive switches
M read sink switches
N read drive switches
N write sink switches The total number of required switches is therefore M(n30 1) + 2N. The minimum current dissipation rating of each of the switches, except the write drive switches, is n(1/2I), while the current dissipation rating of each write drive switch is not less than 1/2I.

In the arrangement shown in FIG. 2, n=2, M=N=4, Thus, the total number of switches is 4(2+) + 2·4 = 12 = 8 = 20. As previously pointd out both M and N are preferably powers of two. Also, to minimize the number of switches if possible, M should be made equal to N but not be greater than N. Even with the present invention if instead of M=N=4, each matrix were arranged wih M=2 and N=8 the total number of required switches would be 2(2+1) + 2·8 = 6 + 16 = 22, rather than 20 when M=N=4. In the prior art with M=2 and N=8 for two word bits the total number of required switches would be 2·2(2+8) = 4 × 10 = 40.

Figure 3:
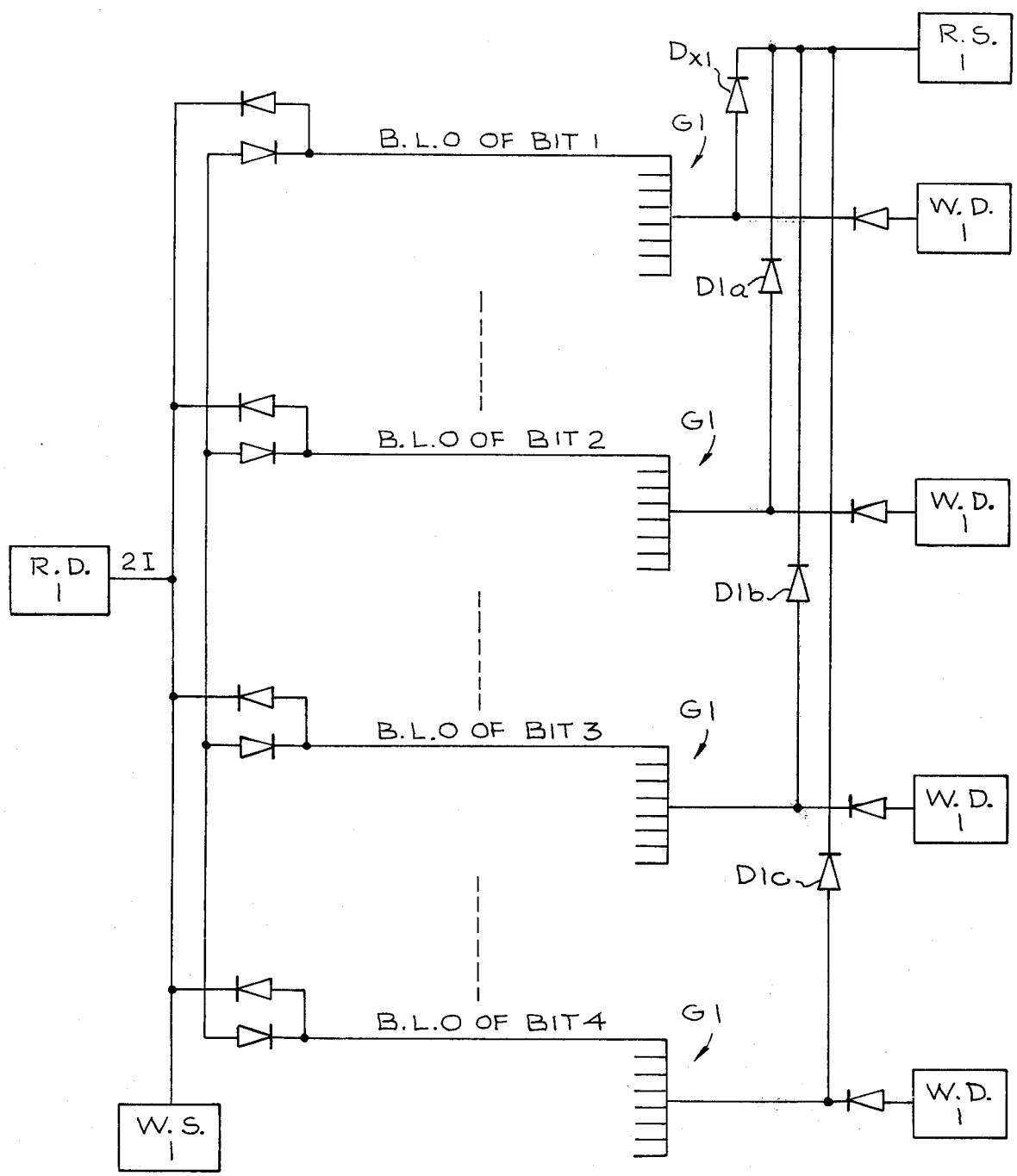
FIG. 3 is a simplified partial diagram of another embodiment of the invention in which switches are used in common to drive bit lines of four word bits.

It should be stressed that the invention is not limited to the use of common switches for bit lines of two word bits nor to the 4 × 4 matrix of 16 bit lines per word bit. For example, FIG. 3 is a simple partial diagram of the invention in which the switches, except for the write drive switches, are used to serve the bit lines of four word bits. It is also assumed therein that each word bit has 32 bit lines arranged in 4 groups, each of eight lines.

In FIG. 3, the first group of G1 of each matrix is partially shown together with the switches needed to drive either read drive current or write drive current through its first bit line B.L.0. In FIG. 3, diodes D1a, D1b and D1c perform the function which was previously described for diode D1. That is, these diodes are used to prevent write drive current from W.D.1 of BIT 1 from reaching any bit line of the other word bits. As previously explained, the diode $D_{X1}$ prevents write drive current from W.D.1 of any of BIT 2, BIT 3 or BIT 4 from propagating to group G1 of BIT 1.

From the foregoing description it should be apparent that for the arrangement shown in FIG. 3, M(n+1) + 2N = 4(4+1) + 2 × 8 = 20 + 16 = 36 switches are required. In the prior art each bit line matrix of M=4 and N=8 requires 2(4+8) = 24 switches per word bit, or a total of 96 switches for four word bits. However, in accordance with the present invention this is achieved with only 36 switches, which represents a most significant reduction in the number of required switches. It should be pointed out however that, whereas in the prior art each of the 96 switches requires a current dissipation rating of not less than 1 2I, in the present invention 20 of the 36 switches require a current dissipation rating of not less than 4(1/2I) = 2I. The other 16 switches, which are the write drive switches, require a current dissipation rating of not less than 1/2I.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. In a 2½D magnetic core memory for storing n-bit words, a plurality, N, of groups of bit lines, being provided for each word bit, each group having the same number, M, of bit lines, each bit line being threaded through a plurality of cores, each core storing a bit of a different word, for an n-bit word there being provided a total of n.N groups of bit lines, each bit in a word being stored in a correspondingly placed core in a different one of said N groups of bit lines, a switching system for said memory comprising:

a separate write drive switch means for each group of bit lines in all of said n.N groups, means connecting each one of said write drive switch means to one of the ends of a different one of the groups of bit lines, a plurality of write sink switch means, the number in said plurality equalling the number, N, of groups of bit lines, means connecting each one of said write sink switch means to the other ends of different but correspondingly located bit lines in all of said n.N groups of bit lines, a plurality of read drive switch means, the number in said plurality equalling the number, N, of groups of bit lines, means connecting each one of said read drive switch means to said other ends of different but correspondingly located bit lines in all of said n.N groups of bit lines, a plurality of read sink switch means, the number of read sink switch means in said plurality equalling the number N of groups of bit lines, and means coupling each read sink switch means to said one ends of a different but correspondingly located group of bit lines in all of said n.N groups of bit lines.

2. In a 2½D magnetic core memory as recited in claim 1 wherein each of the means coupling each one of the read sink switch means to said one ends of a different but correspondingly located group of bit lines in all of said n.N groups of bit lines comprises a first diode, each of the means connecting each one of the write drive switch means to said one of the ends of a different one of the groups of bit lines comprises a second diode, and each said first and second diodes, being connected to each said one ends of said groups of bit lines with an opposite polarity.

3. In a 2½D magnetic core memory as recited in claim 1 wherein each of the means connecting each one of the read drive switch means to said other ends of different but correspondingly located bit lines in all of said .N groups of bit lines comprises a third diode, each of the means connecting each one of the write sink switch means to the other ends of different but correspondingly located bit lines in all of said n.N groups of bit lines comprises a fourth diode, each said third and fourth diode being connected to each of said other ends of said bit lines with an opposite polarity.

* * * * *